United States Patent

Röhr et al.

[11] Patent Number: 6,137,712
[45] Date of Patent: Oct. 24, 2000

[54] FERROELECTRIC MEMORY CONFIGURATION

[75] Inventors: Thomas Röhr, Aschheim; Heinz Hönigschmid, Starnberg; Georg Braun, München, all of Germany

[73] Assignee: Infineon Technologies AG, Munich, Germany

[21] Appl. No.: 09/440,818

[22] Filed: Nov. 15, 1999

[30] Foreign Application Priority Data

Nov. 13, 1998 [DE] Germany ............................ 198 52 570

[51] Int. Cl.[7] .................................................. G11C 11/22
[52] U.S. Cl. ........................................ 365/145; 365/189.07
[58] Field of Search .............................. 365/145, 189.07, 365/190, 129, 189.01

[56] References Cited

U.S. PATENT DOCUMENTS

| | | | |
|---|---|---|---|
| 5,218,566 | 6/1993 | Papaliolios | 365/145 |
| 5,828,615 | 10/1998 | Mukunoki et al. | 365/210 |
| 5,969,979 | 10/1999 | Hirano | 365/145 |
| 6,058,040 | 5/2000 | Tada | 365/145 |

FOREIGN PATENT DOCUMENTS

0278167A2  8/1988  European Pat. Off. .

*Primary Examiner*—David Nelms
*Assistant Examiner*—Hoai V. Ho
*Attorney, Agent, or Firm*—Herbert L. Lerner; Laurence A. Greenberg; Werner H. Stemer

[57] ABSTRACT

The invention relates to a memory configuration comprising a multiplicity of memory cells. Each of the memory cells has at least one ferroelectric storage capacitor and a selection transistor. The memory cells are addressed via word lines and bit line pairs. It is possible for a reference signal obtained from a reference cell pair via a bit line pair to be compared with a read signal from a memory cell in a sense amplifier. The sense amplifier is thereby assigned two bit line pairs connected in such a way that the reference signal is applied via the first bit line pair and, at the same time, the read signal is applied via the second bit line pair to the sense amplifier.

5 Claims, 3 Drawing Sheets

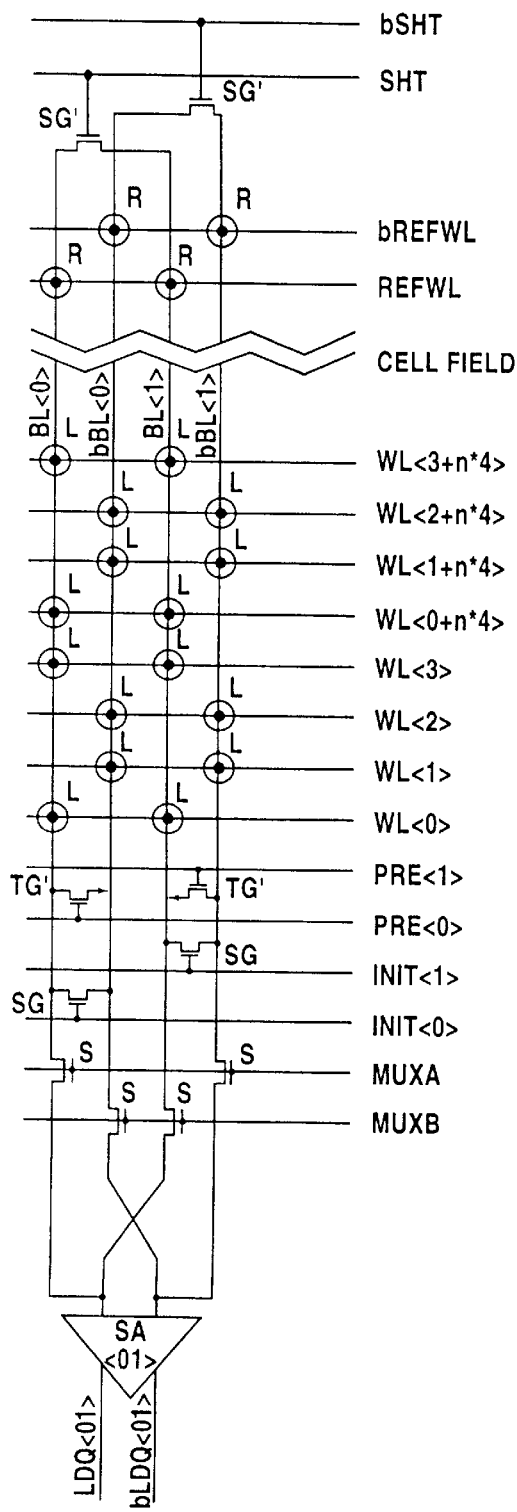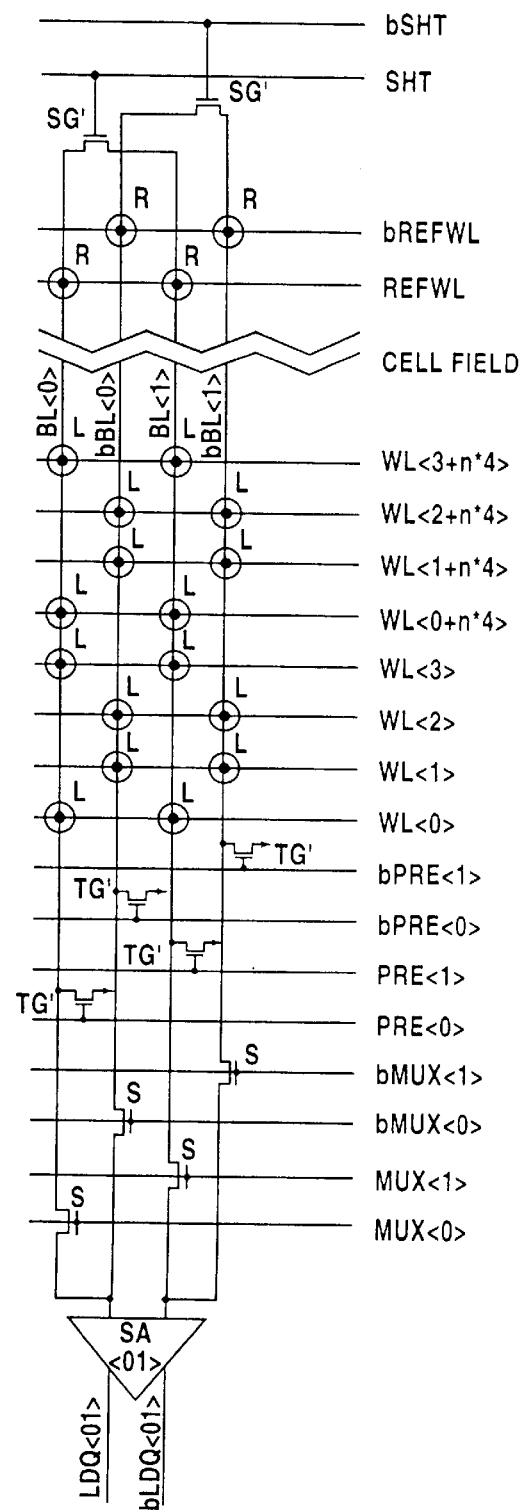

FERROELECTRIC MEMORY CONFIGURATION

BACKGROUND OF THE INVENTION

1. Field of the Invention

The present invention relates to a memory configuration comprising a multiplicity of memory cells, which each have at least one ferroelectric storage capacitor and a selection transistor and are addressed via word lines and bit line pairs. It is thereby possible for a reference signal obtained from a reference cell via a bit line pair to be compared with a read signal from a memory cell in a sense amplifier.

It is known in the art that nonvolatile memory configurations can be constructed using ferroelectric dielectrics made, for example, of bismuth barium tantalate (SBT) or lead zirconium titanate (PZT). In the case of such memory configurations, individual memory cells may each comprise a selection transistor and a storage capacitor with a dielectric made of SBT or PZT, resulting in a so-called "1T/1C cell concept". In principle, storage densities similar to those in conventional DRAMs (dynamic random access memories) can be achieved with the 1T/1C cell concept.

In the event of reading a memory cell having a ferroelectric storage capacitor, a so-called FeRAM memory cell, before the actual information is read from the memory cell, it is necessary firstly to generate a reference voltage, which can be done by reading a reference memory cell pair. Only after the reference voltage has been obtained from the reference memory cell pair is the actual memory cell then read, and the read signal obtained from this memory cell is compared with the previously generated reference voltage in the sense amplifier and evaluated.

Such a necessarily "serial" reading cycle requires a relatively long time since the reference voltage and the actual read signal are generated successively with respect to time. To date, there have been no considerations as to how this relatively long period of time might be shortened.

This can probably essentially be attributed to the fact that to date the method employed to read a memory configuration comprising FeRAM memory cells (i.e., a ferroelectric memory configuration) has been a method similar to that employed to read a DRAM: the memory cell to be read, with a storage capacitor having a ferroelectric dielectric made of SBT or PZT for example, is connected to a bit line by means of the selection transistor of the memory cell. A useful signal of the order of magnitude of a few 100 mV is then produced on the bit line on account of the ratios of the capacitances. This relatively small useful signal is amplified to the full logic level in the sense amplifier. For this purpose, however, the sense amplifier requires a reference voltage, which should preferably represent the mean value of the voltages, which is obtained in each case when a logic zero (0) or a logic one (1) is read from a memory cell. The reference voltage can be generated by reading two reference cells on a bit line pair, whereby the reference cells must contain inverse information, that is to say "zero" and "one". The arithmetic mean of the two read signals previously obtained is obtained by subsequent short-circuiting of the bit line pair. The reference signal thus generated with the mean value is left on one of the two bit lines, while the memory cell to be read is then activated on the other bit line. In the sense amplifier, the voltage that has been read out is then compared with the reference voltage and finally amplified to the full logic level.

The sense amplifier concept of the prior art ferroelectric memory configuration with the conventional serial access cycle will be explained below with reference to FIGS. 4 to 6. FIG. 4 shows a memory cell comprising a ferroelectric storage capacitor Cferro and a selection transistor TG. The source or drain of the selection transistor TG is connected to a bit line BL and the gate of the selection transistor TG is connected to a word line WL. The ferroelectric storage capacitor Cferro is connected between the source or drain of the selection transistor TG and a common plate voltage PL.

A memory cell of that type is represented in FIGS. 1, 3 and 5 by the symbol (i.e., bull's eye target) specified in FIG. 4.

FIG. 5 shows the structural circuitry of a conventional memory configuration with the customary sense amplifier concept for a serial access cycle. In this conventional memory configuration, bit line pairs BL <0> and bBL <0> and BL <1> and bBL <1> are connected via selection transistors S in each case to a sense amplifier SA <0> and SA <1>, respectively. What is essential is that, in this existing memory configuration, reference cells R and cells L to be read are in each case electrically connected to the same bit line pair BL <0> and bBL <0>, and BL <1> and bBL <1>, respectively. This means that only sequential generation of the reference voltage by means of the reference cells R and subsequent reading of the memory cells L are possible.

The sequential generation of the reference voltage and subsequent reading of the memory cell will be explained in more detail below with reference to FIG. 6.

A reading cycle begins for example at t=10 ns with a negative edge of a strobe signal. This is then followed by the generation of a reference voltage ref in a time period A. For this purpose, first of all the two bit lines BL <0> and bBL <0>, for example, are discharged to zero volts (operation "pre" in FIG. 6). Two reference cells R at the interfaces between reference word lines REFWL <03> and REFWL <12> with the bit lines BL <0> and bBL <0> with inverse information are subsequently read, which produces a signal "ref". Finally, the arithmetic mean of the reference voltages of the reference cells R is formed by short-circuiting of the two bit lines BL <0> and bBL <0> by means of a short-circuiting transistor SG, which is driven via a short-circuiting line SHT <0> and SHT <1> respectively (cf. time period "short" in FIG. 6).

In a subsequent time period B, the bit line to be read, that is to say the bit line BL <0>, for example, is then discharged to 0 volts (cf. time period "prerd" in FIG. 6), and the memory cell is then read (cf. time period "read" in FIG. 6).

On the bit line BL <0> to be read, a voltage is then present which is less than or greater than the reference voltage, depending on the memory content of the memory cell L to be read. In the subsequent amplification operation during a time period C, this small voltage is amplified to a full logic level (time period "sense").

Approximately at t=70 ns, that is to say approximately 60 ns after the beginning of the read cycle, the information that has been read is thus available for further processing on data lines LDQ <0> and bLDQ <0>. Finally, the information is also written back to the reference cells R (time period "write back") and the assembly is returned to a quiescent state during a time period D.

FIG. 5 additionally shows switching transistors S, which can be driven via control lines MUX <0> and MUX <1> and connect the individual bit lines BL <0>, bBL <0>, BL <1> and bBL <1> to the sense amplifiers SA <0> and SA <1>, respectively. The memory cells L are each located at positions of intersection of the bit lines BL <0>, bBL <0>, BL <1> and bBL <1> with word lines WL <0>, WL <1>, WL <2>, WL <3>, . . . WL <0+n*4>, WL <1+n*4>, WL <2+n*4> and WL <3+n*4>. The memory cells L in this case form a cell array or cell field, as is illustrated diagrammatically in FIG. 5.

SUMMARY OF THE INVENTION

It is accordingly an object of the invention to provide a ferroelectric memory cell configuration, which overcomes the above-mentioned disadvantages of the heretofore-known devices and methods of this general type and in which the time required for a read cycle can be significantly reduced.

With the foregoing and other objects in view there is provided, in accordance with the invention, a memory configuration, comprising:

a multiplicity of memory cells each having at least one ferroelectric storage capacitor and a selection transistor connected to the storage capacitor;

a plurality of word lines and bit line pairs connected to the memory cells;

a reference cell pair connected to and issuing a reference signal on a bit line pair;

a sense amplifier connected to compare the reference signal with a read signal, and being assigned two bit line pairs; and a short-circuiting component for selectively connecting a bit line of one of the bit line pairs to a bit line of another of the bit line pairs, such that the reference signal is applied via the one bit line pair and, at the same time, the read signal is applied via the other bit line pair to the sense amplifier.

In other words, the objects of the invention are satisfied in a memory configuration of the above-mentioned type, in that the sense amplifier is assigned two bit line pairs that are connected in such a way that the reference signal is applied via the first bit line pair and, at the same time, the read signal is applied via the second bit line pair to the sense amplifier.

In the memory configuration according to the invention, then, a relatively slight circuitry change to the existing concept results in a shortening of the read access to a memory cell by approximately 30%, which will be explained in more detail further below. The change consists, in principle, in the fact that, by means of short-circuiting components, that is to say the above-mentioned transistors SG, it is no longer the case that adjacent bit lines are connected to one another, rather a bit line and the respective next-but-one bit line are connected to one another, so that, therefore, said short-circuiting components connect the respective next-but-one bit lines to one another. These short-circuiting components may preferably be arranged at that end of the cell array which is opposite to the sense amplifier, since here it is easier to realize the crossover of adjacent bit lines in the circuit layout. As a result of the parallel arrangement of the bit line pairs used, the respective active memory cell and the reference cells are situated relatively close together in the same block of the memory cell array, which has a positive effect on the interference immunity. The read signal and the reference signal are switched to the inputs of the respective sense amplifier via the selection transistors S. At the same time, the use of these selection transistors means that the number of sense amplifiers required and thus also the semiconductor chip area required for the sense amplifiers are halved.

In accordance with an added feature of the invention, the short-circuiting element is connected at an end of the bit lines distal from the sense amplifier.

In accordance with an additional feature of the invention, one bit line of a bit line pair is respectively connected to the sense amplifier together with a bit line of an adjacent bit line pair of two mutually adjacent bit line pairs.

In accordance with another feature of the invention, a plurality of initialization transistors are provided for connecting the bit lines of each bit line pair to one another. In this exemplary embodiment, two control lines are no longer used for precharging but rather for short-circuiting the two bit lines.

In accordance with a concomitant feature of the invention, a separately drivable bit line switching transistor is connected in each bit line. It is thus possible for the bit line selection transistors of a bit line pair all to be driven individually, the short-circuiting component no longer connecting adjacent bit lines to one another but rather respective next-but-one bit lines.

Other features which are considered as characteristic for the invention are set forth in the appended claims.

Although the invention is illustrated and described herein as embodied in a ferroelectric memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a first exemplary embodiment of the present invention;

FIG. 3 is a circuit diagram of a second exemplary embodiment of the present invention;

DESCRIPTION OF THE PREFERRED EMBODIMENTS

Figure 2:
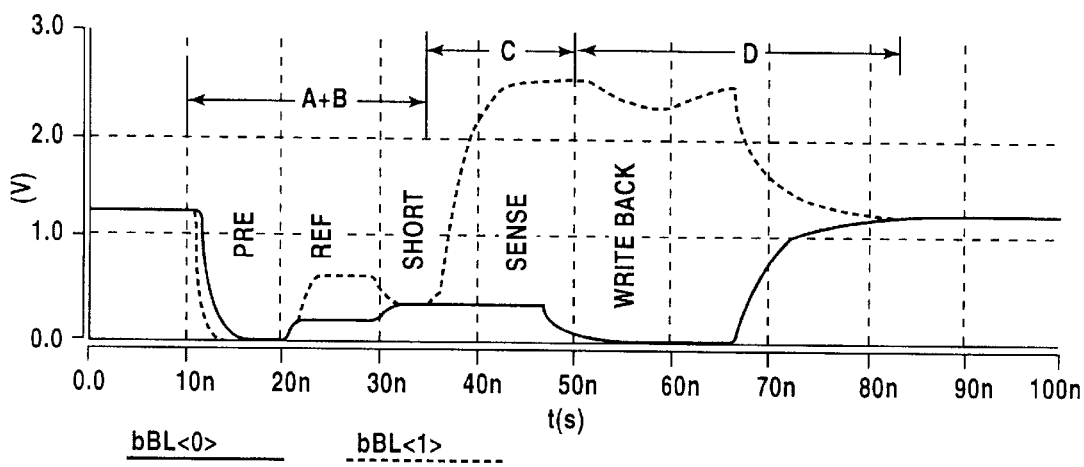
FIG. 2 is a characteristic time chart of a reading operation performed with the exemplary embodiment of FIG. 1.
Figure 6:
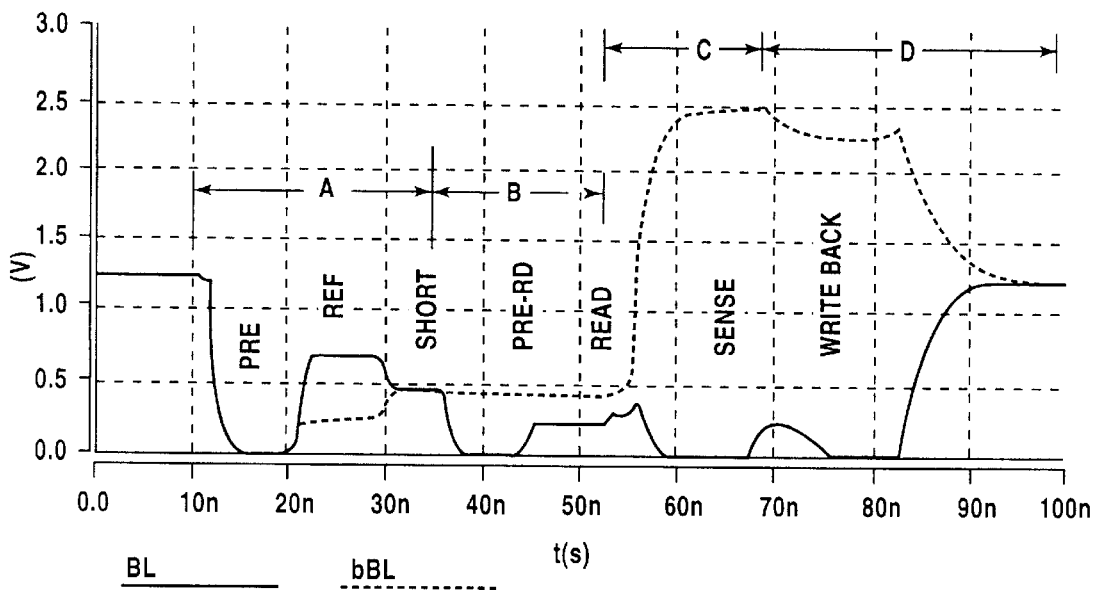
FIG. 6 is a characteristic time chart of a reading operation performed with the memory configuration of FIG. 5.
Figure 4:
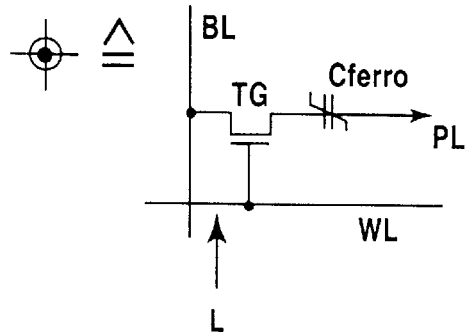
FIG. 4 is a schematic circuit diagram of a memory cell.
Figure 5:
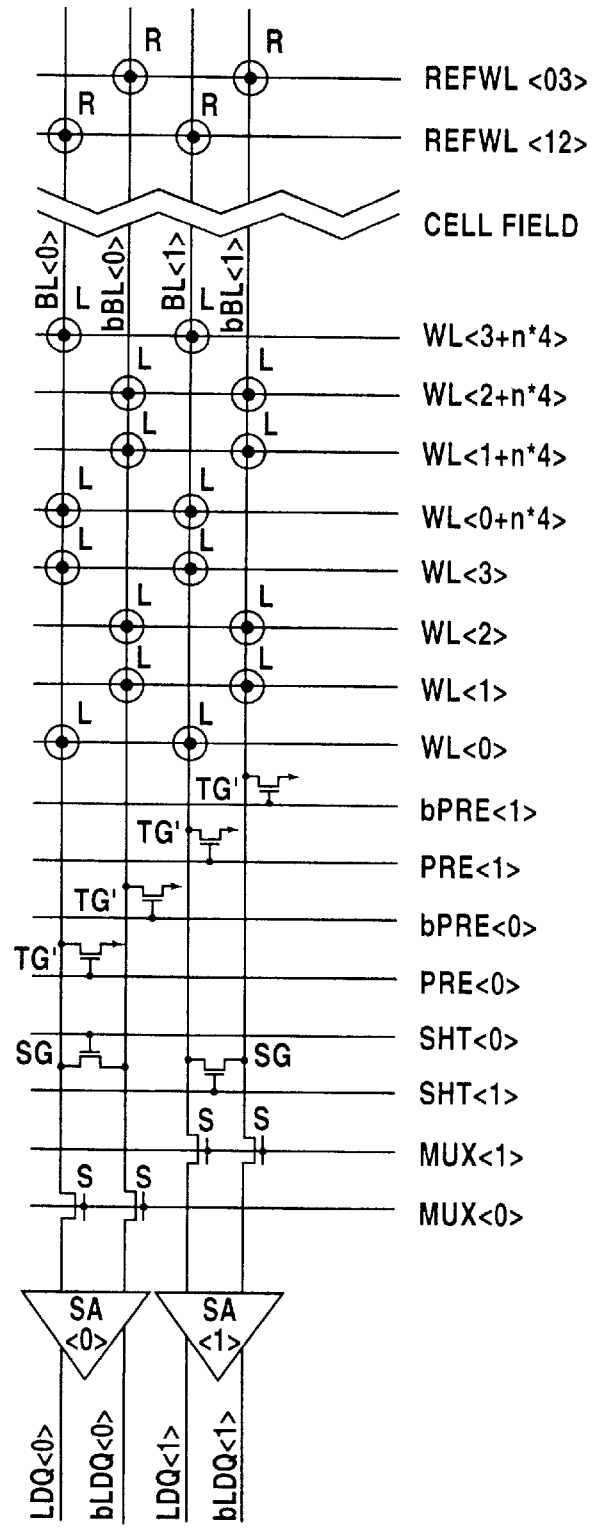
FIG. 5 is a circuit diagram of a conventional memory configuration.

FIGS. 4 to 6 have already been explained in the introduction. In FIGS. 1 to 3, the same reference symbols as in FIGS. 4 to 6 are used for structurally and functionally corresponding parts. Moreover, these structural parts are not described separately.

Referring now to the figures of the drawing in detail and first, particularly, to FIG. 1 thereof, there is seen an exemplary embodiment of the memory configuration according to the invention in which, in contrast to the existing memory configuration according to FIG. 5, short-circuiting components SG' in the form of field-effect transistors no longer connect adjacent bit lines to one another, but rather respective next-but-one bit lines, as is shown for the bit lines BL <0> and BL <1>, and bBL <0> and bBL <1>, respectively. Moreover, two control lines INIT <0> and INIT <1> are in this case no longer used for precharging, but rather for short-circuiting two bit lines BL <0> and bBL <0>, and BL <1> and bBL <1>, respectively. Preferably, the short-circuiting components SG', which connect the respective next-but-one bit lines to one another are arranged at that end of the cell array which is opposite to the sense amplifier SA since here it is easier to realize the crossover of the adjacent bit lines in the circuit layout. As a result of the parallel arrangement of the bit line pairs used, the respective active memory cell and the reference cells are situated relatively close together which has a positive effect on the interference immunity. The read signal and the reference signal are switched to the inputs of the sense amplifier SA <01> via the selection transistors S. At the same time, the use of these selection transistors S means that the number of sense amplifiers SA required and thus also the semiconductor chip area required for the sense amplifiers are halved.

The memory configuration according to FIG. 1 enables the considerably shortened read access to be achieved. This is because the common sense amplifier SA <01> is connected via the four selection transistors S, which are connected to control lines MUXA and respectively MUXB, to the two bit line pairs BL <0> and respectively bBL <0> and BL <1> and respectively bBL <1>. If, by way of example, the memory cell L where the word line <0> crosses the bit line BL <0> is intended to be read, then the reference cells R where the word line bREFWL crosses the bit line bBL <0> and the word line bREFWL crosses the bit line bBL <1> are used to obtain the reference signal. The discharge ("precharge") of the bit line to be read is effected by means of a signal on the line PRE <0>, and the discharge of the reference bit lines is performed by means of signals on the lines PRE <0>, PRE <1> and INIT <0>. The signal on the line INIT <1> remains inactive in this case, however.

If, conversely, the memory cell L where the word line WL <0> crosses the bit line BL <1> is read, then the discharge of the bit line to be read is effected by means of the signal on the line PRE <1> and the line INIT <1>, while the discharge of the reference bit lines is performed by means of the signals on the lines PRE <1> and bSHT. In other words, in this case the short-circuiting component SG' on the short-circuiting line bSHT is also used to discharge the reference bit lines, whereby additional control lines can be obviated.

FIG. 2 shows, similarly to FIG. 6, the signal profile for a corresponding reading cycle for the exemplary embodiment of FIG. 1. The reading operation again begins at an instant t=10 ns, with the negative edge of an STB signal. The generation of the reference voltage (time period A in FIG. 6) and the reading of the memory cell (time period B in FIG. 6) are started simultaneously and on bit line pairs that are not electrically connected. The bit lines bBL <0> and bBL <1> are discharged to 0 volts (time period "pre"), the two reference memory cells R with inverse information are subsequently read (time period "ref"), and, finally, the arithmetic mean is formed by short-circuiting of the two bit lines by means of the short-circuiting element SG' via the short-circuiting line bSHT (time period "short").

At the same time, the bit line BL <0> to be read is discharged to 0 volts (time period "prered"), and the memory cell L is then read (time period "read"). The read signal is then switched to the bit line BL <0> by two switching transistors S by means of the line MUXA, while the reference signal is passed onto the bit line bBL <1> to the sense amplifier SA <01>. The sense amplifier SA <01> amplifies the differential signal in the time period C ("sense" in FIG. 2). Approximately at an instant t=50 ns, that is to say 40 ns after the beginning of the reading cycle, the information that has been read is available for further processing on the data lines LDQ <01> and bLDQ <01>. Finally, the information is also written back to the reference memory cells R (cf. time period "write back") and the memory block is returned to the quiescent state (cf. time period D in FIG. 2).

By virtue of the parallelized reading method, the time taken to provide the valid data is reduced from approximately 60 ns to approximately 40 ns, the reduction in the access time corresponding exactly to the time for the precharging of the bit line to be read ("prered") and the reading of the memory cell ("read").

This reduction in the access time can immediately be seen by comparing FIGS. 2 and 6: in comparison with FIG. 6, the time period "B" is saved in the case of the memory configuration according to the invention, which means a considerable reduction in the read-out time for the memory configuration. The additional outlay on circuitry which is required for this reduction in the read time is practically negligible, which can immediately be seen by comparing the exemplary embodiment of FIG. 1 with the prior art memory configuration of FIG. 5. At the same time, it should also be taken into account, in particular, that the number of sense amplifiers can be halved in the case of the memory configuration according to the invention, which readily compensates for the additional outlay on further switching transistors.

FIG. 3 shows a further exemplary embodiment of the memory configuration according to the invention in which the switching transistors S of the bit line double pairs BL <0>, bBL <0> and BL <1>, bBL <1>, respectively, are all driven individually and the short-circuiting components SG' on the short-circuiting lines SHT and bSHT, respectively, no longer connect adjacent bit lines to one another (cf. FIG. 5), but rather the next-but-one bit lines, as is also the case in the exemplary embodiment of FIG. 1. As in the case of the exemplary embodiment of FIG. 1, in the case of the exemplary embodiment of FIG. 3, too, the common sense amplifier SA <01> is connected via the four switching transistors S, which are driven by control lines MUX <0>, bMUX <0>, MUX <1>, bMUX <1>, to the two bit line pairs BL <0>, bBL <0> and BL <1>, bBL <1>, respectively.

If, by way of example, the memory cell L where the word line WL <0> crosses the bit line BL <0> is intended to be read, then this is effected in a similar manner to that explained above with reference to FIG. 2 for the exemplary embodiment of FIG. 1.

The exemplary embodiment of FIG. 3 thus also enables the reading cycle to be reduced to approximately 40 ns, which means a time gain of approximately one-third relative to the prior art (cf. FIG. 5).

We claim:

1. A memory configuration, comprising:

a multiplicity of memory cells each having at least one ferroelectric storage capacitor and a selection transistor connected to said storage capacitor;

a plurality of word lines and bit line pairs connected to said memory cells;

a reference cell pair connected to and issuing a reference signal on a bit line pair said plurality of bit line pairs;

a sense amplifier connected to compare the reference signal with a read signal, and being assigned two bit line pairs said plurality of bit line pairs; and a short-circuiting component for selectively connecting a bit line of one of said bit line pairs to a bit line of another of said bit line pairs, such that the reference signal is applied via said one bit line pair and, at the same time, the read signal is applied via said other bit line pair to said sense amplifier.

2. The memory configuration according to claim 1, wherein said short-circuiting element is connected at an end of said bit lines opposite said sense amplifier.

3. The memory configuration according to claim 1, wherein one bit line of a bit line pair is respectively connected to said sense amplifier together with a bit line of an adjacent bit line pair of two mutually adjacent bit line pairs.

4. The memory configuration according to claim 3, which comprises a plurality of initialization transistors respectively connecting said bit lines of each bit line pair to one another.

5. The memory configuration according to claim 1, which further comprises a separately drivable bit line switching transistor connected in each bit line.

* * * * *